United States Patent [19]
Broers et al.

[11] 3,971,860
[45] July 27, 1976

[54] METHOD FOR MAKING DEVICE FOR HIGH RESOLUTION ELECTRON BEAM FABRICATION

[75] Inventors: Alec N. Broers, Purdy Station; Thomas O. Sedgwick, Crompond, both of N.Y.

[73] Assignee: International Business Machines Corporation, Armonk, N.Y.

[22] Filed: Feb. 26, 1975

[21] Appl. No.: 553,184

Related U.S. Application Data

[60] Continuation of Ser. No. 358,186, May 7, 1973, abandoned, which is a division of Ser. No. 158,463, June 30, 1971, abandoned.

[52] U.S. Cl. .............................. 427/43; 29/576 R; 96/36.2; 156/13; 156/17
[51] Int. Cl.² ........................................... B05D 3/06
[58] Field of Search ............... 156/8, 11, 13, 17, 3; 29/576, 583, 589; 96/36.2; 427/43

[56] References Cited
UNITED STATES PATENTS

| | | | |
|---|---|---|---|
| 3,239,374 | 3/1966 | Ames et al. | 156/17 |
| 3,437,533 | 4/1969 | Dingwall | 156/17 |
| 3,455,020 | 7/1969 | Dawson et al. | 156/17 |
| 3,486,892 | 12/1969 | Rosvold | 156/17 |
| 3,535,137 | 10/1970 | Haller et al. | 427/43 |
| 3,537,921 | 11/1970 | Boland | 156/17 |
| 3,709,749 | 1/1973 | Sato et al. | 156/13 |
| 3,725,160 | 4/1973 | Bean et al. | 156/17 |
| 3,761,782 | 9/1973 | Youmans | 29/589 |

*Primary Examiner*—John H. Newsome
*Attorney, Agent, or Firm*—Hansel L. McGee

[57] ABSTRACT

The disclosed method is one which provides an extremely thin substrate upon which there can be laid down a high resolution pattern of material such as metal by an electron beam fabrication technique. The latter technique is one wherein a resist is placed on the surface of the substrate. Thereafter, an electron beam is utilized to expose the resist in the desired pattern. The exposed resist is then removed and the metal or other material is laid down on the locations where the resist has been removed. With the use of the very thin substrate, the amount and effect of electron backscattering is substantially minimized whereby the consequent decrease of resolution due to exposure of the resist with the backscattered electrons is effectively eliminated. Accordingly, the resist exposure can be confined to much narrower widths than heretofore possible with known electron beam fabrication techniques.

3 Claims, 12 Drawing Figures

INVENTORS
ALEC N. BROERS
THOMAS O. SEDGWICK

BY Isidore Match
ATTORNEY

METHOD FOR MAKING DEVICE FOR HIGH RESOLUTION ELECTRON BEAM FABRICATION

This application is a continuation of application Ser. No. 358,186, filed May 7, 1973, now abandoned, which was a division of application Ser. No. 158,463, filed June 30, 1971, now abandoned.

BACKGROUND OF THE INVENTION

This invention relates to electron beam fabrication techniques. More particularly, it relates to a method of making such device which enables extremely high resolution electron beam fabrication.

In the known high resolution electron beam fabrication techniques, there is employed a resist which is coated on to the device substrate by conventional techniques such as spinning. Thereafter, an electron beam is applied to the resist to expose the resist in accordance with the pattern which is desired. Such technique has been utilized, for example, wherein it is desired to provide a pattern of narrow metal lines on a substrate.

It has been found that the ultimate resolution, i.e., the minimum line width, for example, that can be obtained in such fabrication processes is limited by electron scattering both in the resist and back out of the substrate. The minimum line width is not determined by the electron beam diameter. In this connection, electrons from the electron beam may penetrate into the substrate to a distance of two or three microns. Since many substrates have a thickness which is effectively infinite as compared to this penetration distance, there are, therefore, produced a large number of backscattered electrons. The latter tend to expose the resist in the areas adjacent to the portion of the resist exposed by the electron beam, with the consequent result that the width of the exposed area on the resist is substantially wider than the diameter of the electron beam. Such backscattering, consequently, has been a limiting factor in the obtaining of high resolution such as the reduction of the width of metal lines which are provided on a substrate in an electron beam fabrication technique. In this connection, about the narrowest width obtainable by known electron beam techniques of metal lines has been about 700A. Devices comprising very high resolution patterns of a material on a substrate find wide application in electronic circuitry and like devices and the substantial improvement of their resolution would be very advantageous in the miniaturization of circuit devices and in devices utilized for research in fundamental phenomena in physics and in engineering.

Accordingly, it is an important object of this invention to provide a method of making a device upon which there can be laid down a high resolution pattern of material including lines having widths substantially smaller than those heretofore producible.

SUMMARY OF THE INVENTION

In accordance with the invention, there is provided a method for making a device wherein at least portions comprise a very thin substrate in the thickness dimension upon which there can be laid down a resist for use in an electron beam fabrication technique, the technique functioning to expose the resist on the substrate in a high resolution pattern upon which, after development of the pattern, there can be deposited correspondingly a material in such high resolution pattern. The method comprises laying down a very thin layer of a substrate material on the top and bottom surfaces of a support, removing portions of the bottom substrate layer in a pattern of a plurality of windows and removing the support material overlying the removed windows whereby there remains in the top layer of substrate the aforementioned pattern of windows without any underlying support material. On these windows, there is thereafter laid down a resist. A very high resolution pattern is then exposed with an electron beam. The exposed resist is subsequently developed during which process the resist in the exposed areas is removed. Metal or other material is then deposited over the whole substrate after which the unexposed resist, together with the metal over the resist is removed by solvents suitable for such purpose. With this method, there accordingly results a device wherein a material structure remains on the substrate at the locations where the electron beam was used to expose the required pattern. The widths of metal lines attainable with this method may be as small as 300A because of the elimination of electron backscattering from the substrate.

The foregoing and other objects, features and advantages of the invention will be apparent from the following more particular description of the preferred embodiments of the invention as illustrated in the accompanying drawings.

DESCRIPTION OF A PREFERRED EMBODIMENT

Figure 1:
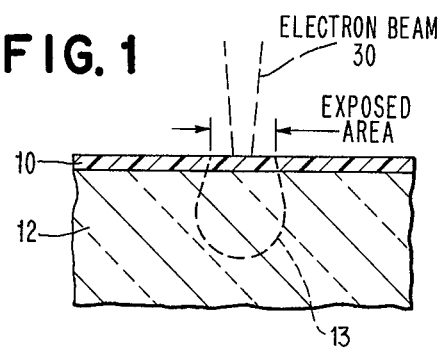
FIG. 1 is a depiction, in section, of the known method for providing a pattern of metal lines on a substrate utilizing electron beam fabrication techniques.
Figure 2:
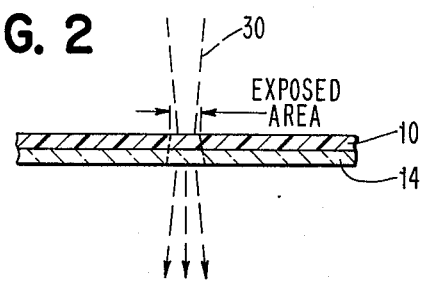
FIG. 2 shows the method utilizing electron beam fabrication techniques, for providing a pattern of extremely narrow metal lines on a substrate, according to the invention.

In considering the invention, reference is first made to FIGS. 1 and 2. FIG. 1 is a schematic depiction of the presently known technique for providing areas on the surface of a substrate upon which material can be laid down in a high resolution pattern such as metal lines.

FIG. 2 is a depiction of the inventive concept wherein an electron beam can be employed to provide areas on the substrate for laying down the high resolution pattern such as metal lines thereon, the metal lines being very narrow such as 300A.

Thus, referring to FIG. 1, the conventional technique comprises the placing of a resist layer 10 on a substrate 12 and then exposing the resist to an electron beam 30 according to the pattern of lines which it is desired to lay down on the substrate. After the resist has been exposed, the exposed portions are removed by a suitable solvent, whereby there remain exposed areas on the substrate upon which a material such as metal can be laid down suitably by an evaporation technique. Considering the technique depicted in FIG. 1, it is realized that electron penetration as shown by area 13 into the substrate may be as much as 2 to 3 microns in a substrate which have substantially infinite thickness in relation thereto. The relatively extensive backscattering of electrons caused by such penetration causes further exposure of the resist in the vicinity of the portion exposed by the electron beam whereby the effective exposed area as shown by the arrows is substantially wider than that exposed by the electron beam alone. Consequently, it is very difficult to achieve extreme narrowness of exposure in the photoresist with a correspondingly consequent narrowness of the laid down material such as metal. Practically, about the narrowest width that can be achieved with the technique shown in FIG. 1 is about 700A.

In FIG. 2 wherein there is depicted the inventive concept, there is utilized an extremely thin substrate 14 which can have a depth of from 300 to 10,000A. In this situation, since the electrons from the electron beam have so little substrate material to penetrate before they exit therethrough, the backscattering of electrons is substantially less than that produced in the technique shown in FIG. 1. Consequently, there is much less exposure of the resist due to backscattering with the result that the electron beam exposed areas are substantially narrower. Thus, the principle of the invention is the providing of an extremely thin substrate in electron beam fabrication, i.e., exposing a resist with an electron beam to provide exposed areas which are substantially narrower than has been heretofore achieved by known electron fabrication techniques. The substrate can be any material that can be provided with a substantially planar surface and relatively even structures in a very thin form such as about 300A to 10,000A. Thus, the substrate can be a polymer which lends itself to being provided in sheet form in such thickness, a metal and the like. There follows hereinbelow an embodiment of a process for providing the desired thin substrate.

Figure 3:
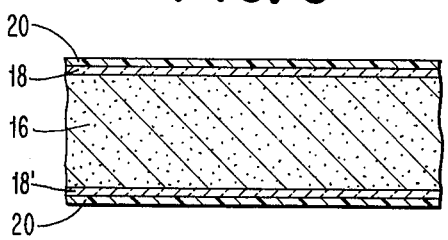
FIG. 3 is a view, in section, of the first steps in the method according to the invention.
Figure 4:
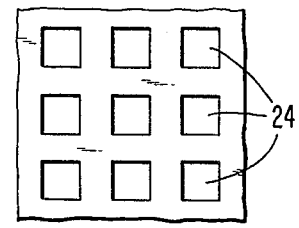
FIG. 4 shows a window pattern which is developed on the resist on the bottom surface of the device in the inventive method.
Figure 5:
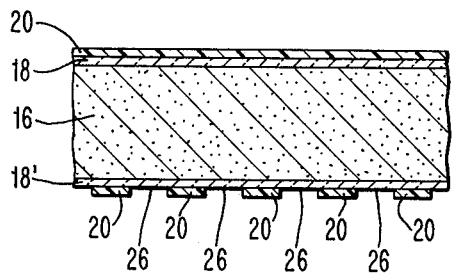
FIG. 5 is a view, in section, which shows the stage of device preparation after the window pattern has been developed on the bottom surface.
Figure 6:
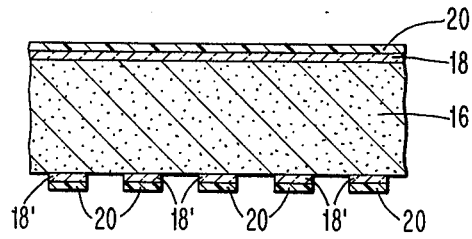
FIG. 6 is a view, in section, which shows the device after the substrate layer has been removed from the window pattern on the lower surface.
Figure 7:
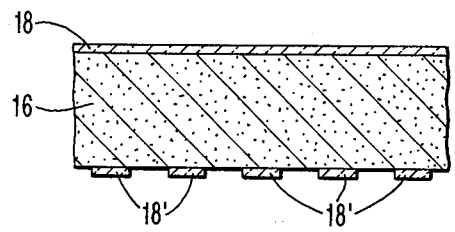
FIG. 7 is a view, in section, which shows the device after the photoresist has been removed from its upper and lower surfaces.
Figure 8:
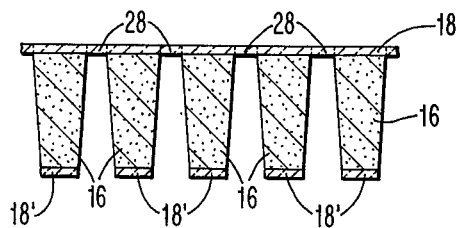
FIG. 8 is a view in section of a strip portion of the device which depicts the device after the substrate windows have been formed therein.

Referring to FIG. 3, there is shown the first step in this process. This first step comprises the coating of the top and bottom surfaces of a silicon wafer 16 with a layer of silicon nitride 18 and 18′. The silicon nitride can suitably be produced by the reaction of silicon hydride and ammonia at 820°C, the process being carried out in a suitable conventional vapor deposition chamber. On both silicon nitride layers 18 and 18′, there are placed a photoresist layer 20 by a suitable technique such as spinning. The resist layers may suitably have a thickness of about 1,000A. The photoresist layer 20 on layer 18′ is exposed in a pattern as shown in FIG. 4 wherein there are provided an array of rectangular openings 24 which may suitably have dimensions of about 4–25 mils by 4–25 mils. The exposure of photoresist layer 20 in accordance with the pattern shown in FIG. 4 results in the arrangement shown in FIG. 5 wherein there are now provided exposed areas 26 on the lower silicon nitride layer 18′ which have the same configuration as windows 24. The lower silicon nitride layer 18″ is now subjected to an etching solution such as hydrogen fluoride to etch dissolve the exposed portions of the silicon nitride. After the exposed portions of silicon nitride have been removed, as shown in FIG. 6 and photoresist layer 20 on the bottom surface as shown in FIG. 7, the silicon directly above the exposed portions is subjected to a treatment by an etching solution which may suitably be a 30% sodium hydroxide solution or pyrocatechol-ethylene diamine. The structure resulting from the silicon etching is shown in FIG. 8. There thereby results the production of thin windows 28 consisting only of the silicon nitride of layer 18.

Figure 9:
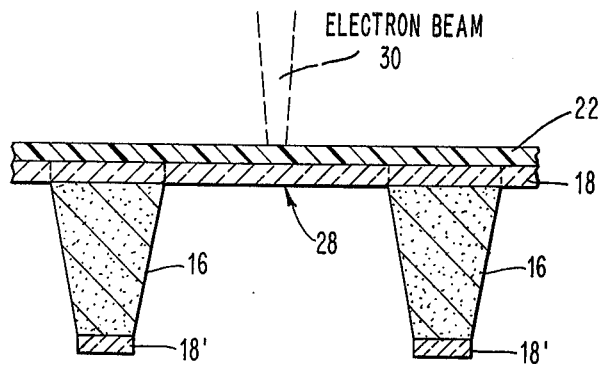
FIG. 9 illustrates the application of an electron beam to the device for forming the high resolution material pattern on its substrate windows.
Figure 10:
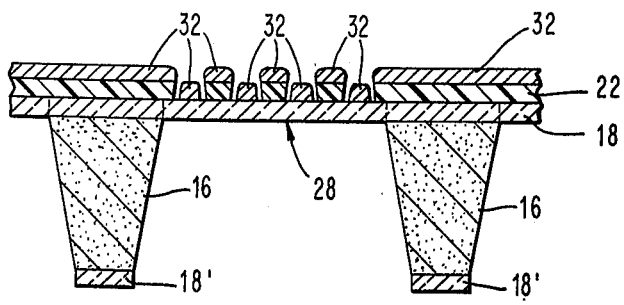
FIG. 10 shows the device of FIG. 9 after a pattern has been formed on a substrate window and material deposited thereon.
Figure 11:
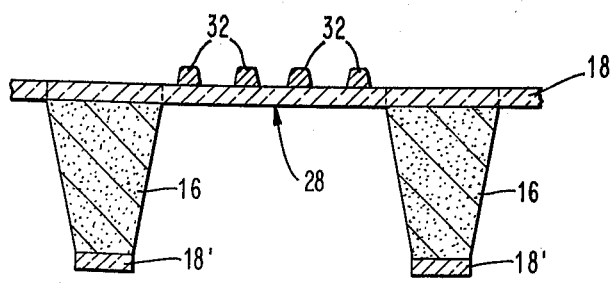
FIG. 11 shows the device with FIGS. 9 and 10 of a material line pattern on a window and the remainder of resist removed.
Figure 12:
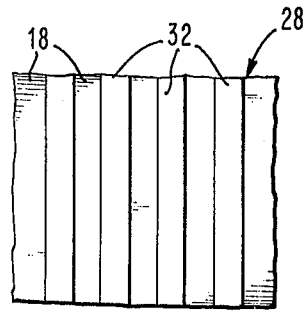
FIG. 12 is a plan view of a narrow material line pattern on a substrate window.

FIG. 9 shows one of these windows in greatly expanded scale subjected to an electron beam 30, there having been placed an electron resist layer 22 on layer 18. It is seen that, with the resulting structure shown in FIG. 9, there can be effected the production of a very high resolution exposure of electron resist 22 since backscattering of electrons due to the thinness of substrate layer 18 is substantially eliminated. After the resist portion over window 28 is exposed and removed by a suitable solvent, metal or other material can be laid down such as by evaporation onto the exposed portion whereby there results the structure shown in FIG. 10 wherein the material such as metal layer 32 rests upon the unexposed portions of resist layer 22 and at the exposed portion is deposited on the silicon nitride layer 18. There now merely remains the dissolution of the remainder of resist layer 22 and the removal of the portions of metal layer 32 on the resist layer whereby there results the structure shown in FIG. 11. FIG. 12 is a plan view of the pattern of metal or other material lines which can result from the inventive method as shown hereinabove.

In carrying out the above-described process for producing the silicon nitride, any suitable photoresist such as AZ1350, KMER, etc., manufactured by Eastman Kodak Company can be used for masking the silicon nitride layer 18 on the bottom surface of the silicon. The solvent for removing this resist can be suitably one such as Stoddard developer and Shipley 1350 developer. A resist for the surface receiving the electron beam may suitably be one such as polymethyl methacrylate, and a solvent for removing this resist suitably being trichloroethylene. The electron beam apparatus can be of the type manufactured by the Cambridge Scientific Instrument Company and its use can be as described in the publication of T. P. Chang entitled "Device Fabrication Using Scanning Electron Beam System," Proceedings of 4th Scanning Electron Microscope Symposium, IIT Research pages 417–424, dated 1971.

As has been mentioned hereinabove, within the purview of the inventive concept, there is contemplated the use of a thin substrate in an electron beam fabrication technique to substantially minimize backscatter of electrons to thereby consequently commensurately reduce exposure of the resist. In this connection, there has been described the preparation of an example of a thin substrate. However, it is to be realized that many materials may be suitable for this purpose such as other inorganic films or organic polymers which can be provided in extremely thin layers such as 1000A, a typical example of such an inorganic film being $Al_2O_3$.

While the invention has been particularly shown and described with reference to preferred embodiments thereof, it will be understood by those skilled in the art that the foregoing and other changes in form and details may be made therein without departing from the spirit and scope of the invention.

We claim:

1. A method for making devices for high resolution electron beam fabrication comprising the steps of:

coating two parallel surfaces of a semiconductor wafer substrate with first and second layers of a base material on opposing surfaces, coating said first and second layers of base material with a suitable photoresist material, exposing the first of said photoresist layers in a predetermined pattern, developing said exposed photoresist to expose the first of said base material layers in said predetermined pattern, etching said first base material layer with a suitable etchant to thereby expose the surface of said substrate thereunder in said predetermined pattern, removing the photoresist layers from said base material layers, etching the surface of said substrate until it is completely dissolved thereby producing thin windows consisting of the second of said base material layers according to said predetermined pattern, depositing an electron resist on said second base material layer, exposing said resist to an electron beam at the location of said thin windows in a predetermined pattern, developing said resist in said predetermined pattern to expose the surface of said second base material layer, and depositing a metal on said surface of said second base material layer and thereafter removing the unexposed resist and metal thereon to provide a highly resolved metal pattern on said second base material layer.

2. The method of claim 1 wherein said semiconductor wafer is a silicon wafer and said base material layers are thin silicon nitride layers.

3. The method of claim 1 wherein said base material layers are from about 300A to about 10,000A thick.

* * * * *